(12) United States Patent
Kato et al.

(10) Patent No.: US 6,340,374 B1
(45) Date of Patent: Jan. 22, 2002

(54) POLISHING SLURRY AND POLISHING METHOD

(75) Inventors: Hiroshi Kato; Naoto Mochizuki, both of Tokuyama; Hiroyuki Kono, Shiki, all of (JP)

(73) Assignee: Tokuyama Corporation, Yamaguchi-ken (JP)

( * ) Notice: Subject to any disclaimer, the term of this patent is extended or adjusted under 35 U.S.C. 154(b) by 0 days.

(21) Appl. No.: 09/536,316

(22) Filed: Mar. 27, 2000

(30) Foreign Application Priority Data

Mar. 13, 1999 (JP) ............................................. 11-093070

(51) Int. Cl.$^7$ ............................. C09K 3/14; C09G 1/02
(52) U.S. Cl. ............................. 51/308; 106/3; 138/692; 138/693
(58) Field of Search ............................. 51/308; 106/3; 438/692, 693

(56) References Cited

U.S. PATENT DOCUMENTS

| 4,588,421 A | 5/1986 | Payne |
| 5,264,010 A | 11/1993 | Brancaleoni et al. |
| 5,783,489 A | * 7/1998 | Kaufman et al. .............. 51/308 |
| 6,027,669 A | * 2/2000 | Miura et al. .................... 106/3 |

FOREIGN PATENT DOCUMENTS

| EP | 0 773 270 | 5/1997 |
| EP | 0 874 036 | 10/1998 |
| JP | 7-502778 | 3/1995 |
| JP | 11-315273 | 11/1999 |
| WO | 93/22103 | 11/1993 |

\* cited by examiner

Primary Examiner—Micheal Marcheschi
(74) Attorney, Agent, or Firm—Wenderoth, Lind & Ponack, LLP (57) ABSTRACT

A polishing slurry having a high polishing rate is provided. A polishing slurry comprising water, fumed silica having an average primary particle size of 9 to 60 nm and spherical silica having an average primary particle size of 40 to 600 nm excluding the fumed silica, wherein a content of the whole silicas obtained by totaling the fumed silica and the spherical silica falls in a range of 1 to 40% by weight, and a process for polishing a semiconductor device using the polishing slurry described above.

16 Claims, 4 Drawing Sheets

POLISHING SLURRY AND POLISHING METHOD

FIELD OF THE INVENTION

The present invention relates to a polishing slurry and a polishing method using the same. More specifically, the present invention provides a novel polishing slurry used in chemically and mechanically polishing an interlayer insulating film ($SiO_2$) and a metal film formed on a silicon wafer, and a polishing method using the same.

BACKGROUND OF THE INVENTION

As semiconductor devices are highly integrated, wiring techniques advance more and more toward fineness and multilayer. Advance toward fineness and multilayer in wiring increases and steepens a difference in a level between layers, so that a processing accuracy and a reliability of the wirings formed thereon tend to be lowered.

Chemical and mechanical polishing (hereinafter abbreviated as CMP) is paid attentions for solving the problems described above. A CMP method is a means for polishing an interlayer insulating film such as a silicon dioxide film and a metal film of aluminum, tungsten or the like which forms a wiring layer to thereby planarize them in a production process of semiconductor devices. A higher polishing rate, less contamination of a material to be polished, smaller scratches and a higher selectivity are required to polishing slurry used in CMP.

The preceding performances of the polishing slurry depend largely on abrasive grain components such as silica and cerium oxide which are principal raw materials. For example, a polishing slurry using fumed silica for abrasive grains which has so far been often used does not necessarily have a satisfactory polishing rate and has been desired to be further improved in a polishing rate. Particularly in a semiconductor production process, the polishing rate is related to a productivity of devices, and therefore it has been strongly desired to elevate the polishing rate.

An object of the present invention is to provide a polishing slurry having a high polishing rate which is used for CMP.

Another object of the present invention is to provide a polishing slurry having a high productivity, which makes it possible to polish a device.

SUMMARY OF THE INVENTION

The preceding objects of the present invention can be achieved by a polishing slurry comprising water, fumed silica and spherical silica having an average primary particle size of 40 to 600 nm excluding the fumed silica.

DETAILED DESCRIPTION OF THE PREFERRED EMBODIMENTS

The fumed silica used in the present invention shall not specifically be restricted, and publicly known ones can be used. In general, fumed silica having an average primary particle size (herein-after abbreviated as a primary particle size) of 7 to 70 nm (the specific surface area: 400 to 40 $m^2/g$) is available and can be used for the present invention. In particular, fumed silica having a primary particle size of 9 to 60 nm (the specific surface area: 300 to 45 $m^2/g$) reveals an excellent polishing effect and therefore is suited. The specific surface area described above means a specific surface area obtained according to a BET method, and the primary particle size means a particle size reduced according to the following equation:

$$d = 6 \times 10^3 / (D \times S) \qquad \text{(equation 1)}$$

wherein d is a primary particle size (unit: nm); D is a density (unit: $g/cm^3$) of the particles; and S is a BET specific surface area (unit: $mz^2/g$).

When other inorganic oxide particles such as alumina, titania, zirconia and the like are used in place of the fumed silica, the other inorganic oxide particles and spherical silica which shall be described later cause coagulation and settle down, and therefore there is the possibility that the polishing slurry becomes instable and scratches are formed on the surface of a matter to be polished (refer to Comparative Example 2 which shall be described later).

Publicly known ones can be used for the other component in the present invention without any restrictions as long as they are spherical silica having an average primary particle size of 40 to 600 nm excluding the fumed silica. In light of an effect to improve a polishing rate of the polishing slurry, the spherical silica has preferably a primary particle size of 60 to 300 nm, more preferably 90 to 200 nm.

The primary particle size of the spherical silica means an average primary particle size determined from the images observed by means of a scanning type electron microscope or a transmission type electron microscope. Further, observation using the electron microscope images described above makes it possible to determine the particle form and the particle size distribution of the spherical silica.

The spherical silica used in the present invention has a primary particle size of 40 to 600 nm and is spherical, whereby it can elevate a polishing rate of the fumed silica when it is used in combination with the fumed silica. When silica particles having such a small primary particle size as 10 to 30 nm like those of silicas produced by a precipitation method are used, the polishing rate of the fumed silica can not be elevated as apparent from Comparative Example 1 which shall be explained later. Further, when irregular silica particles and broken silica particles are used, the polishing rate of the fumed silica can not be elevated as well, and scratches tend to be produced on the surface of a matter to be polished. Accordingly, it is not preferred.

A ratio of a diameter of a circle inscribed to the particle to a diameter of a circle circumscribed to the particle of the spherical silica used in the present invention is preferably 0.6 to 1.0, more preferably 0.7 to 1.0 when it is observed under an electron microscope.

Further, the spherical silica used in the present invention has preferably a sharp particle size distribution from the viewpoint of a reproducibility of a polishing rate. The particle size distribution can be determined by using, for example, a particle size distribution meter having a high accuracy or analyzing electron microscopic images by means of an image analysis apparatus. The spherical silica used in the present invention has preferably a variation coefficient of 40% or less, more preferably 30% or less and further more preferably 20% or less in a primary particle size, which is determined by the apparatus described above.

The kind of the spherical silica shall not specifically be restricted as long as it is spherical and has an average primary particle size of 40 to 600 nm. Examples given as the typical spherical silica include spherical silica produced by burning metal silicon or silane base gas in flame, spherical silica produced by melting fine powder of silica in flame, spherical silica produced by a so-called sol-gel process in which alkoxysilane is hydrolyzed and spherical colloidal silica produced by an Ostwald ripening using sodium silicate as a raw material.

In the spherical silica used in the present invention, a colloidal dispersion rather than dry powder is better used in a certain case. That is, the spherical silica used in the present invention is preferably synthesized in a liquid phase and produced without passing through a drying step. Silica particles synthesized in a liquid phase have the characteristics that they are excellent in a dispersibility and have many silanol groups in the silica particles and that they are soft silica particles and less liable to scratch a matter to be polished. Further, an effect of elevating the polishing rate tends to be raised by using such silica particles rather than dry powder and calcined powder. On the other hand, silica particles which are dried or calcined have the problems that they tend to be strongly coagulated and are less liable to be redispersed and that the preceding variation coefficient of the primary particle size is lowered.

Examples given as a typical production process for such spherical silica include spherical silica produced by a so-called sol-gel process in which alkoxysilane is hydrolyzed and spherical colloidal silica produced by an Ostwald ripening using sodium silicate as a raw material.

The polishing slurry of the present invention has a content of an Na element of 100 ppm or less, preferably 10 ppm or less, more preferably 1 ppm or less and most preferably 0.1 ppm or less. The reasons therefor are that there is the possibility that when a polishing slurry having a high content of impurities, particularly an Na element is used for polishing devices, washing them after polishing requires much time and labor or a yield of the devices is reduced. A purity of a polishing slurry, particularly a content of an Na element is influenced by a purity of abrasive grains (fumed silica and spherical silica) in many cases. Accordingly, fumed silica and spherical silica each having a high purity are preferably used. In general, fumed silicas having a high purity can be available. Typical spherical silica having a high purity is colloidal silica produced by hydrolyzing alkoxysilane. Use of such fumed silica of a high purity and spherical silica of a high purity makes it relatively easy to control a content of an Na element in the polishing slurry to 1 ppm or less, preferably 0.1 ppm or less.

When a lot of impurities such as Na are contained in the spherical silica, impurity ions are preferably removed sufficiently by washing with acid or ion exchange.

In the present invention, a ratio (spherical silica/fumed silica) of an average primary particle size of the spherical silica to an average primary particle size of the fumed silica is preferably 1 to 30, more preferably 1.5 to 20 since an effect of elevating the polishing rate is increased.

In the polishing slurry of the present invention, the whole silicas obtained by totaling the fumed silica and the spherical silica excluding the fumed silica have preferably a content falling in a range of 1 to 40% by weight based on the weight of the polishing slurry. If the content of the whole silicas is less than 1% by weight, the polishing rate is reduced in some cases. On the other hand, if the content exceeds 40% by weight, the viscosity of the polishing slurry increases too much, and handling thereof becomes difficult in a certain case.

An optimum addition proportion is present in a proportion of the spherical silica to the whole silicas according to a combination of a primary particle size of the spherical silica with a primary particle size of the fumed silica used for the polishing slurry. As described in the examples which shall be described later, for example, in polishing an interlayer insulating film ($SiO_2$ film), the polishing rate can be maximized in a proportion of 10 to 20% by weight of the spherical silica to the whole silicas when the fumed silica of 90 $m^2/g$ (primary particle size: 30 nm) is blended with the spherical silica having a primary particle size of 139 nm. Also, the polishing rate can be maximized in a proportion of 20 to 30% by weight of the spherical silica to the whole silicas when the fumed silica of 50 $m^2/g$ (primary particle size: 55 nm) is blended with the spherical silica having a primary particle size of 139 nm. Further, the polishing rate can be maximized in a proportion of 40 to 95% by weight, preferably 50 to 90% by weight of the spherical silica to the whole silicas when the fumed silica of 300 $m^2/g$ (primary particle size: 9 nm) is blended with the spherical silica having a primary particle size of 48 nm.

On the other hand, in polishing a metal film (Cu film), the polishing rate can be maximized in a proportion of 40 to 70% by weight of the spherical silica to the whole silicas when the fumed silica of 200 $m^2/g$ (primary particle size: 14 nm) is blended with the spherical silica having a primary particle size of 139 nm.

Further, in polishing a barrier film (TaN film), the polishing rate can be maximized in a proportion of 60 to 90% by weight of the spherical silica to the whole silicas when the fumed silica of 200 $m^2/g$ (primary particle size: 14 nm) is blended with the spherical silica having a primary particle size of 139 nm.

As shown by the results described above, the polishing slurry of the present invention tends to be different in a suitable addition proportion according to a combination of a primary particle size of the spherical silica with a primary particle size of the fumed silica or the kind of a matter to be polished. That is, in polishing the interlayer insulating film, the spherical silica having a primary particle size of 40 to 600 nm is preferably added to the fumed silica having a primary particle size of 20 to 60 nm (specific surface area: 136 to 45 $m^2/g$) in a range of 5 to 50% by weight, more preferably 10 to 40% by weight in terms of a proportion to the whole silicas. Further, the spherical silica having a primary particle size of 40 to 600 nm is preferably added to the fumed silica having a primary particle size of 9 to 20 nm (specific surface area: 300 to 136 $m^2/g$) in a range of 40 to 95% by weight, more preferably 50 to 90% by weight in terms of a proportion to the whole silicas.

In polishing the metal film (Cu film) or the barrier film (TaN film), the spherical silica having a primary particle size of 40 to 600 nm is preferably added to the fumed silica having a primary particle size of 9 to 20 nm (specific surface area: 300 to 136 m$^2$/g) in a range of 35 to 95% by weight, more preferably 40 to 90% by weight in terms of a proportion to the whole silicas.

A pH of the polishing slurry of the present invention shall not specifically be restricted and may be any value of pH 1 to 12. It can suitably be controlled according to a matter to be polished.

In the present invention, the effect of elevating the polishing rate is particularly high when polishing the interlayer insulating film (SiO$_2$ film). In this case, an alkaline agent such as ammonia and KOH is preferably used to control a pH of the polishing slurry to a range of 10 to 11.5. In this case, a concentration of the whole silicas contained in the polishing slurry falls preferably in a range of 5 to 15% by weight, but the polishing slurry of the present invention has the characteristics that it can achieve the same polishing rate as those of conventional products at a lower silica concentration since it has a higher polishing rate as compared with those of conventional polishing slurry. Further, it is possible to prepare a polishing slurry having a high concentration of 20 to 40% by weight and use it diluting by 2 to 8 times, and therefore the present invention is markedly effective in terms of a reduction in the cost of the polishing slurry, a reduction in the physical distribution cost and a reduction in the wastes after polishing.

Further, additives such as oxidizing agents, reducing agents, water soluble salts, water soluble high polymers, surfactants and the like can freely be added to the polishing slurry of the present invention according to purposes. For example, in polishing a barrier film of Ti, TiN, Ta or TaN and a metal film of Cu, W or Al present on an interlayer insulating film, the barrier film and the metal film can effectively be polished by adding 0.1 to 10% by weight of an oxidizing agent such as hydrogen peroxide to the polishing slurry of the present invention.

A production process for the polishing slurry shall not specifically be restricted, and publicly known processes can be employed. It can be produced by mixing prescribed amounts of water, the fumed silica and the spherical silica and then dispersing them by means of a disperser having a relatively strong shearing force. In this case, alkalis, acids and various additives can be added.

The present invention provides as well a polishing process characterized by polishing a semiconductor device by means of a polishing slurry comprising water, fumed silica and spherical silica. The semiconductor device described above means principally an integrated circuit formed on an Si wafer, and the polishing slurry of the present invention can be used when polishing and planarizing an interlayer insulating film (SiO$_2$ film) formed on a device and a metal film in producing an integrated circuit. In this case, the polishing slurry of the present invention can be increased in a polishing rate as compared with those of conventional polishing slurry and therefore can produce devices at a good productivity. Further, the polishing rate against a specific film to be polished can be elevated, and therefore polishing can be carried out at a high selectivity.

The present invention shall be explained below with reference to examples, but the present invention shall by no means be restricted by these examples.

Synthetic Example of Spherical Silica Particles

A reactor having a content volume of about 4 liters which was provided with a jacket was charged with 1800 g of methanol and 200 g of aqueous ammonia (25% by weight) respectively and mixed well to prepare a reaction solution. Next, dropwise added separately into the reaction solution at the same time in the solution were methyl silicate [Si(OCH$_3$)$_4$] at a rate of 2.5 g/min and aqueous ammonia (12% by weight) at a rate of 1.4 g/min respectively while maintaining the reaction solution at a temperature of 20° C. and stirring at a revolution of 180 rpm. The reaction solution started becoming cloudy little by little about 10 minutes after starting dropwise adding methyl silicate, and it was confirmed that silica particles were produced. Dropping was finished 8 hours after starting dropwise adding. Dropwise added were 1200 g of methyl silicate and 660 g of aqueous ammonia in total. After continuing stirring for further one hour, the suspension in the system was taken out. The resulting suspension was a homogeneous milk white slurry having a weight of about 3800 g and contained about 460 g of the silica particles.

Methanol which was the solvent and ammonia were removed from the silica slurry synthesized above by means of an evaporator. Distillation was further continued while adding pure water, and the slurry was heated for 2 hours or longer at a temperature of 90° C. or higher at which the slurry boiled to adjust the silica concentration to 15% by weight. The silica slurry described above had a pH of 7.3.

The electron microscopic images of the silica particles described above were analyzed by means of an image analysis apparatus, which resulted in finding that the average primary particle size was 139 nm and the variation coefficient of the primary particle size was 19% and that the ratio of the diameter of the inscribed circle to the diameter of the circumscribed circle of the silica particle was 0.78.

Measurements of Various Physical Properties

1. Viscosity

The viscosity of the polishing slurry was measured at 25° C. by means of a B type viscometer (BL type manufactured by Tokimeck Inc.).

2. Specific gravity

The specific gravity of the polishing slurry was measured at 25° C. by means of a floating specific gravimeter.

3. pH

The pH of the polishing slurry was measured at 25° C. by means of a pH meter.

4. Average particle size

The average particle size of mixed particles contained in the polishing slurry was measured by means of a particle size distribution meter (BI-DCP manufactured by Nikkiso Co., Ltd.) according to a disc system high-speed centrifugal settling method.

5. Content of Na element

The content of an Na element contained in the polishing slurry was measured according to an atomic absorption method.

Polishing Test

In order to investigate a polishing rate against an interlayer insulating film (SiO$_2$ film), a silicon wafer of 4 inches provided with a thermally oxidized film was used to carry out a polishing test. IC1000/SUBA400 manufactured by Rodel Co., Ltd. was used for a polishing pad to carry out the polishing test on the conditions of a processing pressure of 400 g/cm$^2$, a base disc revolution of 40 rpm and a dropping rate of the polishing slurry of 120 ml/min.

Further, a wafer provided with a metal film (Cu film) and a barrier film (TaN film) was used to carry out the polishing test in the same manner as described above to investigate the polishing rates against the respective films.

EXAMPLES 1 and 2

Fumed silica having a specific surface area of 90 m$^2$/g (primary particle size: 30 nm) and the spherical colloidal silica as spherical silica, formed in the synthetic example described above were blended in prescribed amounts. Further, ammonia (Example 1) or KOH (Example 2) was added in a prescribed amount, and the mixture was diluted with demineralized water so that the whole silica amount accounted for 13% by weight to prepare a raw material slurry. The raw material slurry described above was dispersed by means of a disperser having a high shearing property (high pressure homogenizer: Nanomizer LA-31 manufactured by Nanomizer Inc.) to prepare a polishing slurry. The polishing slurry described above was used to evaluate a polishing performance against an interlayer insulating film.

Figure 1:
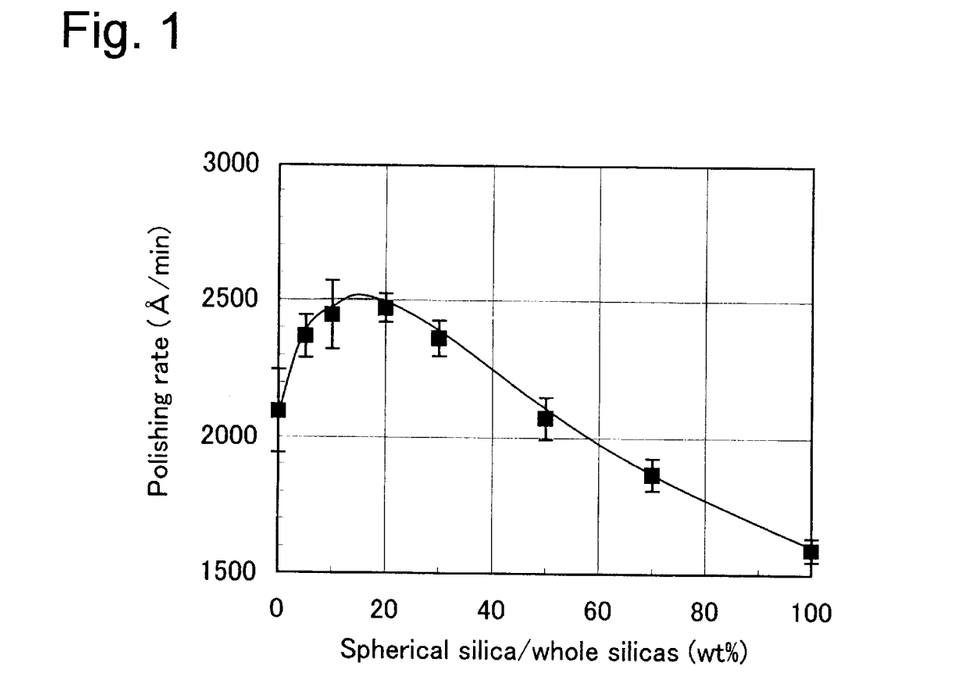
FIG. 1 is a graph showing a relation of the polishing rate to a proportion of the spherical silica to the whole silicas in the polishing slurry prepared in Example 1.
Figure 2:
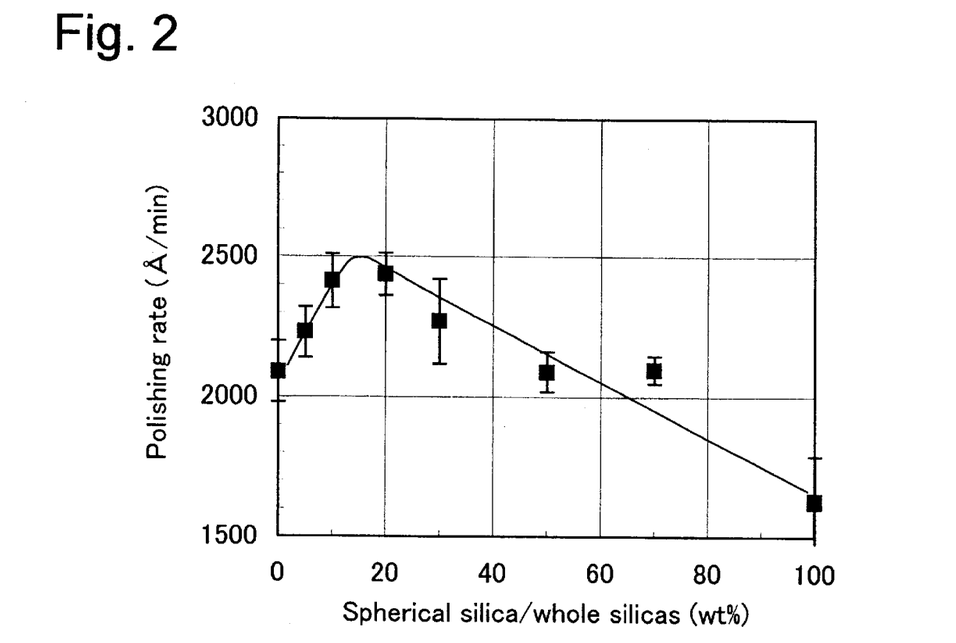
FIG. 2 is a graph showing a relation of the polishing rate to a proportion of the spherical silica to the whole silicas in the polishing slurry prepared in Example 2.

Shown respectively were a result of the polishing rate of the ammonia base polishing slurry in FIG. 1 and a result of the polishing rate of the KOH base polishing slurry in FIG. 2. It was found that both of the ammonia base and the KOH base showed a tendency to increase in a polishing rate by adding a small amount of the spherical colloidal silica to the fumed silica and that when the proportion thereof was 10 to 20% by weight, the polishing rate showed a maximum value. Observed in this example was the effect of improving in the polishing rate by about 20% at the largest as compared with that of the polishing slurry containing only the fumed silica.

Shown were the various physical properties of the ammonia base polishing slurry in Table 1 and the various physical properties of the KOH base polishing slurry in Table 2. The pH and the specific gravity were not changed so much when the addition proportion of the spherical colloidal silica was changed. The viscosity and the average particle size were almost proportional to the addition proportion of the spherical colloidal silica. Further, the Na contents were 0.1 ppm or less which was a detection lower limit in the case of the ammonia base polishing slurry and 0.2 to 0.4 ppm in the case of the KOH base polishing slurry. The reason why the Na content was high in the KOH base polishing slurry was that Na was contained as an impurity in KOH added as alkaline agent. The contents of heavy metals such as Fe, Cr, Ni and Cu were 0.1 ppm or less in all cases.

silica as spherical silica, formed in the synthetic example described above were blended in prescribed amounts. Further, ammonia was added in a prescribed amount to prepare a polishing slurry having a whole silica amount of 13% by weight and a pH of about 11. The polishing slurry described above was used to evaluate a polishing performance against an interlayer insulating film.

Figure 3:
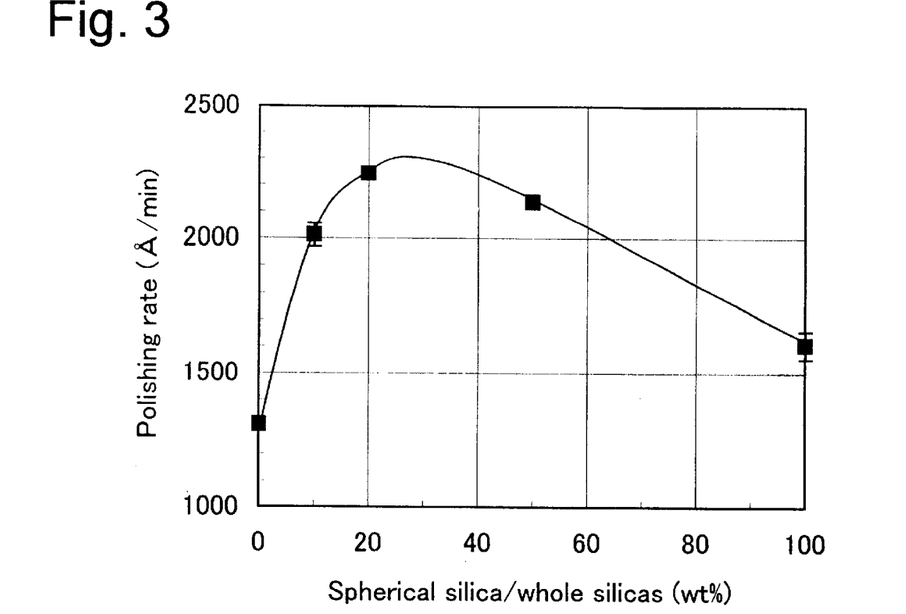
FIG. 3 is a graph showing a relation of the polishing rate to a proportion of the spherical silica to the whole silicas in the polishing slurry prepared in Example 3.

A result of the polishing rate was shown in FIG. 3. In this example, the polishing slurry containing only the spherical colloidal silica had a higher polishing rate than that of the polishing slurry containing only the fumed silica. In the case of the polishing slurry prepared by mixing both, it was found that the state was a little different from that in Example 1 but the polishing rate was the highest when the addition amount of the spherical colloidal silica was 20 to 30% by weight. Observed in this example was the effect of improving in the polishing rates by about 70% at the largest as compared with that of the polishing slurry containing only the fumed silica and about 40% at the largest as compared with that of the polishing slurry containing only the spherical colloidal silica. The Na content in the experimental polishing slurry was 0.1 ppm or less.

EXAMPLE 4

Fumed silica having a specific surface area of 300 m²/g (primary particle size: 9 nm) and the spherical colloidal silica having a primary particle size of 48 nm (the ratio of the diameter of the inscribed circle to the diameter of the circumscribed circle of the silica particle was 0.76 and the variation coefficient of the primary particle size which was determined by means of an image analysis apparatus was 17%) prepared by changing the conditions in the synthetic example described above were blended in prescribed amounts. Further, ammonia was added in a prescribed amount to prepare a polishing slurry having a whole silica amount of 13% by weight and a pH of about 11. The polishing slurry described above was used to evaluate a polishing performance against an interlayer insulating film.

Figure 4:
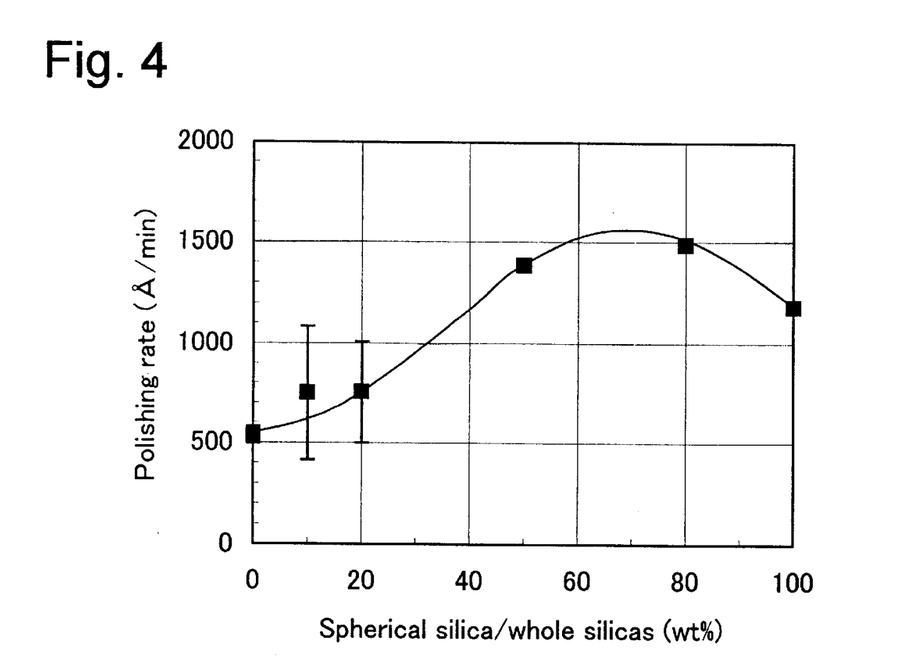
FIG. 4 is a graph showing a relation of the polishing rate to a proportion of the spherical silica to the whole silicas in the polishing slurry prepared in Example 4.

A result of the polishing rate was shown in FIG. 4. In this example, the polishing slurry containing only the spherical

TABLE 1

| Spherical silica/whole silicas | 0 | 5 | 10 | 20 | 30 | 50 | 70 | 100 |
|---|---|---|---|---|---|---|---|---|
| Viscosity (mPa·s) | 3.1 | 2.9 | 2.8 | 2.6 | 2.3 | 2.0 | 1.7 | 1.4 |
| Specific gravity | 1.070 | 1.069 | 1.069 | 1.069 | 1.068 | 1.068 | 1.067 | 1.067 |
| pH | 10.7 | 10.8 | 10.8 | 10.8 | 10.8 | 10.8 | 10.9 | 10.8 |
| Average particle size (nm) | 112 | 114 | 122 | 126 | 130 | 152 | 156 | 177 |
| Na Content (ppm) | <0.1 | <0.1 | <0.1 | <0.1 | <0.1 | <0.1 | <0.1 | <0.1 |

TABLE 2

| Spherical silical/whole silicas | 0 | 5 | 10 | 20 | 30 | 50 | 70 | 100 |
|---|---|---|---|---|---|---|---|---|
| Viscosity (mPa·s) | 2.7 | 2.6 | 2.6 | 2.4 | 2.2 | 1.9 | 1.7 | 1.3 |
| Specific gravity | 1.086 | 1.086 | 1.086 | 1.086 | 1.086 | 1.087 | 1.088 | 1.088 |
| pH | 11.0 | 10.8 | 10.9 | 10.9 | 10.8 | 10.7 | 10.8 | 10.8 |
| Average particle size (nm) | 100 | 109 | 122 | 128 | 131 | 149 | 166 | 193 |
| Na Content (ppm) | 0.2 | 0.2 | 0.2 | 0.3 | 0.3 | 0.3 | 0.4 | 0.4 |

EXAMPLE 3

Fumed silica having a specific surface area of 50 m²/g (primary particle size: 55 nm) and the spherical colloidal colloidal silica had a higher polishing rate than that of the polishing slurry containing only the fumed silica. In the case of the polishing slurry prepared by mixing both, it was found that the state was pretty different from that in the example described above but the polishing rate was the highest when the addition amount of the spherical colloidal silica was 50 to 90% by weight. Observed was the effect of improving in the polishing rate by about 25% at the largest as compared with that of the polishing slurry containing only the spherical colloidal silica. The Na content in the experimental polishing slurry was 0.1 ppm or less.

EXAMPLE 5

A polishing slurry was prepared in the same manner as that in Example 1, except that spherical colloidal silicas having various primary particle sizes shown in the following Table 3 were used as the spherical silica to evaluate a polishing performance against an interlayer insulating film. The spherical colloidal silicas used here were commercial colloidal silicas produced using sodium silicate as a raw material, and used were those having Na contents which were reduced to a large extent by repeating five times an acid washing step (dipping in diluted hydrochloric acid, centrifugal separation and washing with demineralized water). The addition amount of the spherical colloidal silicas was controlled to 10% by weight based on the whole silicas.

TABLE 3

| No. | Primary particle size (nm) | Diameter of inscribed circle/diameter of circumscribed circle | Variation coefficient |
|---|---|---|---|
| 1 | 40 | 0.77 | 18 |
| 2 | 80 | 0.78 | 17 |
| 3 | 113 | 0.82 | 14 |
| 4 | 135 | 0.82 | 10 |
| 5 | 279 | 0.80 | 19 |
| 6 | 553 | 0.88 | 6 |

Figure 5:
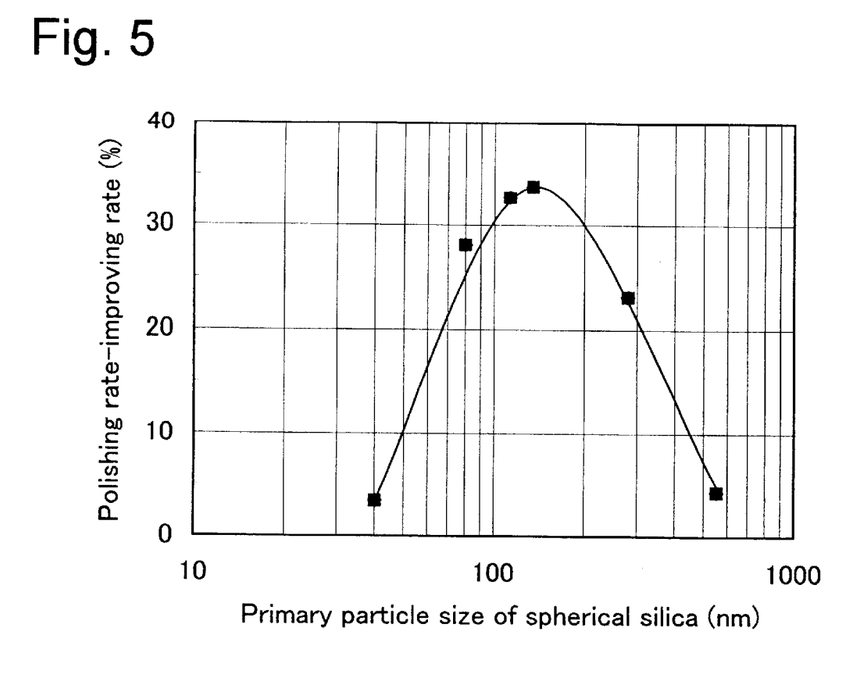
FIG. 5 is a graph showing a relation of the rise rate in polishing rate to the primary particle size of the spherical silica.

In the result of the polishing test, a rise rate in the polishing rate of the polishing slurry prepared by adding 10% by weight of the spherical silica versus that of the polishing slurry comprising only the fumed silica was shown in FIG. 5. It was found from this result that the added spherical silica having a primary particle size falling in a range of 40 to 600 nm was effective and particularly the spherical silica having a primary particle size of 90 to 200 nm showed a very high effect. The Na contents in the polishing slurry fell in a range of 65–90 ppm in all cases.

EXAMPLE 6

A polishing slurry was prepared in the same manner as that in Example 1, except that spherical silica produced in flame (Excelica SE-1 manufactured by Tokuyama Corp.) was added as the spherical silica to evaluate a polishing performance against an interlayer insulating film. As a result thereof, an effect of elevating the polishing rate by about 9% was observed in the polishing slurry prepared by adding 10% by weight of the spherical silica as compared with the polishing slurry comprising only the fumed silica. The Na content in the experimental polishing slurry was 0.1 ppm or less.

The spherical silica used above had a ratio of 0.77 of the diameter of the inscribed circle to the diameter of the circumscribed circle, a primary particle size of 275 nm which was determined by means of an image analysis apparatus and a variation coefficient of 48% in the primary particle size.

EXAMPLE 7

Fumed silica having a specific surface area of 200 $m^2/g$ (primary particle size: 14 nm) and the spherical colloidal silica as spherical silica, formed in the synthetic example described above were blended in prescribed amounts to prepare a neutral polishing slurry having a whole silica amount of 4% by weight and a pH of 6 to 7. Added to the polishing slurry described above was 1% by weight (as $H_2O_2$) of hydrogen peroxide to examine the polishing rates against a metal film (Cu film) and a barrier film (TaN film) respectively. With respect to the method, a polishing test was carried out in the same manner as that in Example 1, except that a silicon wafer on which a Cu film and a TaN film were formed was used.

Figure 6:
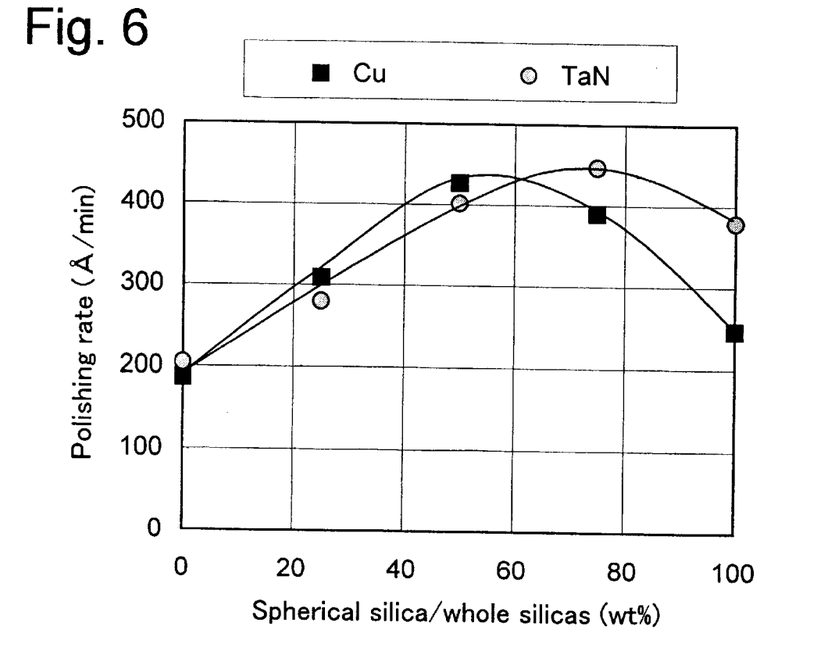
FIG. 6 is a graph showing a relation of the polishing rate to a proportion of the spherical silica to the whole silicas in the polishing slurry prepared in Example 7.

A result of the polishing rate was shown in FIG. 6. It was found in this example that the state was varied according to the matters to be polished. That is, a marked effect of elevating the polishing rate was shown against the Cu film when the spherical colloidal silica accounted for 40 to 70% by weight and against the TaN film when the spherical colloidal silica accounted for 60 to 90% by weight. The Na content in the experimental polishing slurry was 0.1 ppm or less, and the contents of heavy metals such as Fe, Cr, Ni and Cu were 0.1 ppm or less in all cases.

As shown in the example described above, it was found that the polishing slurry of the present invention was very effective as well when selectively polishing the Cu film or the TaN film.

Comparative Example 1

Amorphous precipitated silica was substituted for the spherical silica.

Commercial sodium silicate and demineralized water were put in a reactor so that a concentration of sodium silicate became 5%. The temperature of the reactor was set to 40° C. to carry out neutralization reaction (neutralization rate: up to 50%) using sulfuric acid of 22% by weight, and then the temperature of the reaction solution was elevated to 95° C. Sulfuric acid described above was added to this reaction solution until the neutralization rate reached 100%. Filtering and washing operations were repeated to resulting silica to obtain a dehydrated cake (silica content: 15% by weight). Added to 2 kg of the dehydrated cake described above was 500 g of demineralized water, and the mixture was stirred by means of a propeller mixer to thereby carry out preliminary mixing. The resulting pasty silica slurry was treated three times at a treating pressure of 500 $kgf/cm^2$ by means of a high pressure homogenizer (Nanomizer LA-31 manufactured by Nanomizer Inc.) to obtain a silica dispersion.

The electron microscopic image of the silica described above was analyzed to find that silicas having a primary particle size of 10 to 30 nm were coagulated by several ten to several hundred units.

Figure 7:
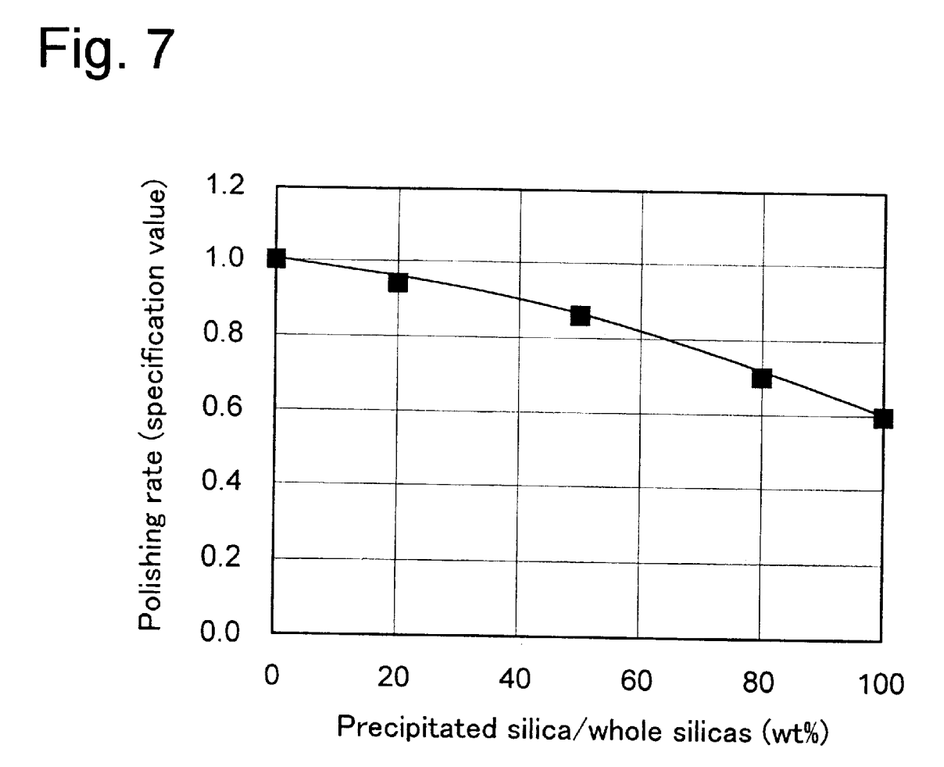
FIG. 7 is a graph showing a relation of the polishing rate to a proportion of the precipitated silica to the whole silicas in the polishing slurry prepared in Comparative Example 1.

A polishing slurry was prepared in the same manner as that in Example 1, except that the precipitated silica described above was substituted for the spherical silica. A result of the polishing rate of the polishing slurry was shown in FIG. 7. When the precipitated silica described above was substituted for the spherical silica, an effect of elevating the polishing rate was not observed at all.

Comparative Example 2

A polishing slurry was prepared in the same manner as that in Example 1, except that the respective inorganic oxide particles of titania, alumina and zirconia were substituted for the fumed silica to evaluate a polishing performance against an interlayer insulating film. The addition amount of the spherical silica particles was controlled to 20% by weight based on the whole particles. The results thereof are shown in Table 4.

Unlike the case of the fumed silica in Example 1, the polishing slurry prepared produced depositions at the bottom of a vessel after several hours passed when any inorganic oxide particles were used. That is, it was found that a combination of the inorganic oxide particles with the spherical silica was liable to coagulate the particles each other. Such coagulation provides a possibility to produce scratches on a surface to be polished.

Further, a polishing experiment was carried out while forcibly stirring the polishing slurry, but the polishing rates were not raised by mixing the spherical silica particles when any inorganic oxide particles were used.

TABLE 4

| Kind of inorganic oxide particles | Primary particle size (nm) | Ratio of spherical silica/ whole particles | | |
| --- | --- | --- | --- | --- |
| | | 0% | 20% | 100% |
| Titania | 56 | 1372 | 729 | 1600 |
| Alumina | 41 | 1044 | 711 | 1600 |
| Zirconia | 180 | 9258 | 7638 | 1600 |

(Polishing rate: Å/min)

What is claimed is:

1. A polishing slurry comprising water, fumed silica and spherical silica having an average primary particle size of 40 to 600 nm excluding the fumed silica.

2. The polishing slurry as described in claim 1, wherein the fumed silica has an average primary particle size of 9 to 60 nm.

3. The polishing slurry as described in claim 1, wherein a ratio of a diameter of an inscribed circle to a diameter of a circumscribed circle of the spherical silica is 0.6 to 1.0.

4. The polishing slurry as described in claim 1, wherein the spherical silica has a variation coefficient of 40% or less in a primary particle size.

5. The polishing slurry as described in claim 1, wherein the spherical silica is synthesized in a liquid phase and produced without passing through a drying step.

6. The polishing slurry as described in claim 1, wherein a content of an Na element in the polishing slurry is 1 ppm or less.

7. The polishing slurry as described in claim 2, wherein a ratio of an average primary particle size of the spherical silica to an average primary particle size of the fumed silica is 1 to 30.

8. The polishing slurry as described in claim 2, wherein the ratio of an average primary particle size of the spherical silica to an average primary particle size of the fumed silica is 1.5 to 20.

9. The polishing slurry as described in claim 1, for polishing an interlayer insulating film of a semiconductor and comprising 50 to 95% by weight of the fumed silica having an average primary particle size of 20 to 60 nm and 50 to 5% by weight of the spherical silica having an average primary particle size of 40 to 600 nm in terms of a proportion to the whole silicas.

10. The polishing slurry as described in claim 1, for polishing an interlayer insulating film of a semiconductor and comprising 60 to 90% by weight of the fumed silica having an average primary particle size of 20 to 60 nm and 40 to 10% by weight of the spherical silica having an average primary particle size of 40 to 600 nm in terms of a proportion to the whole silicas.

11. The polishing slurry as described in claim 1, for polishing an interlayer insulating film of a semiconductor and comprising 5 to 60% by weight of the fumed silica having an average primary particle size of 9 to 20 nm and 95 to 40 by weight of the spherical silica having an average primary particle size of 40 to 600 nm in terms of a proportion to the whole silicas.

12. The polishing slurry as described in claim 1, for polishing an interlayer insulating film of a semiconductor and comprising 10 to 50% by weight of the fumed silica having an average primary particle size of 9 to 20 nm and 90 to 50% by weight of the spherical silica having an average primary particle size of 40 to 600 nm in terms of a proportion to the whole silicas.

13. The polishing slurry as described in claim 1, for polishing a metal film and a barrier film of a semiconductor and comprising 5 to 65% by weight of the fumed silica having an average primary particle size of 9 to 20 nm and 95 to 35% by weight of the spherical silica having an average primary particle size of 40 to 600 nm in terms of a proportion to the whole silicas.

14. The polishing slurry as described in claim 1, for polishing a metal film and a barrier film of a semiconductor and comprising 10 to 60% by weight of the fumed silica having an average primary particle size of 9 to 20 nm and 90 to 40% by weight of the spherical silica having an average primary particle size of 40 to 600 nm in terms of a proportion to the whole silicas.

15. A process for polishing a semiconductor device comprising polishing the semiconductor device using the polishing slurry as described in claim 1.

16. The polishing slurry as claimed in claim 1 which consists essentially of water, fumed silica and spherical silica having an average particle size of 40 to 600 nm excluding the fumed silica.

* * * * *